United States Patent
Kunkel

(10) Patent No.: US 7,482,110 B2
(45) Date of Patent: Jan. 27, 2009

(54) METHOD FOR ADAPTING STRUCTURE DIMENSIONS DURING THE PHOTOLITHOGRAPHIC PROJECTION OF A PATTERN OF STRUCTURE ELEMENTS ONTO A SEMICONDUCTOR WAFER

(75) Inventor: Gerhard Kunkel, Radebeul (DE)

(73) Assignee: Infineon Technologies AG, Munich (DE)

( * ) Notice: Subject to any disclaimer, the term of this patent is extended or adjusted under 35 U.S.C. 154(b) by 510 days.

(21) Appl. No.: 11/170,189

(22) Filed: Jun. 29, 2005

(65) Prior Publication Data

US 2006/0001858 A1 Jan. 5, 2006

(30) Foreign Application Priority Data

Jun. 30, 2004 (DE) .................. 10 2004 031 688

(51) Int. Cl.
G03F 7/20 (2006.01)
G03F 9/00 (2006.01)
G02B 5/20 (2006.01)
G02B 5/30 (2006.01)

(52) U.S. Cl. .................. 430/311; 430/30; 355/53; 355/71; 355/77

(58) Field of Classification Search .......... 430/311, 430/30; 355/77, 53, 71
See application file for complete search history.

(56) References Cited

U.S. PATENT DOCUMENTS

| | | | |
|---|---|---|---|
| 5,872,617 A | 2/1999 | Unno | |
| 5,922,513 A * | 7/1999 | Jeon et al. | 430/311 |
| 6,522,483 B2 | 2/2003 | Kreuzer | |
| 6,620,559 B2 | 9/2003 | Czech et al. | |
| 6,836,380 B2 | 12/2004 | Kreuzer | |
| 2003/0148195 A1* | 8/2003 | Takeuchi | 430/5 |
| 2003/0174408 A1* | 9/2003 | Rostalski et al. | 359/642 |
| 2005/0136334 A1* | 6/2005 | Dierichs et al. | 430/5 |

FOREIGN PATENT DOCUMENTS

| | | |
|---|---|---|
| DE | 196 50 722 A1 | 6/1997 |
| DE | 100 48 151 A1 | 5/2002 |
| JP | 05-109601 A | 4/1993 |
| JP | 09-167735 | 6/1997 |
| WO | WO 01/82000 A1 | 11/2001 |

* cited by examiner

*Primary Examiner*—Mark F Huff
*Assistant Examiner*—Brittany Raymond
(74) *Attorney, Agent, or Firm*—Slater & Matsil, L.L.P.

(57) ABSTRACT

The invention relates to a method for adapting structure dimensions during the photolithographic projection of a pattern of structure elements onto a semiconductor wafer. An exposure device (5) is provided, which can emit light in two polarization planes (32; 34). Through the choice of the degree of polarization, i.e., the ratio of the intensity in the first polarization plane (32) to the intensity in the second polarization plane (34), it is possible to alter the ratio of width (40) to length (42) of the resist structure (36) formed on the resist layer (14). A variation of approximately 30% with respect to dimensionally accurate imaging can thus be achieved in a simple manner.

30 Claims, 4 Drawing Sheets

16

24

26  18
28  20
5

22

38  14
12
10

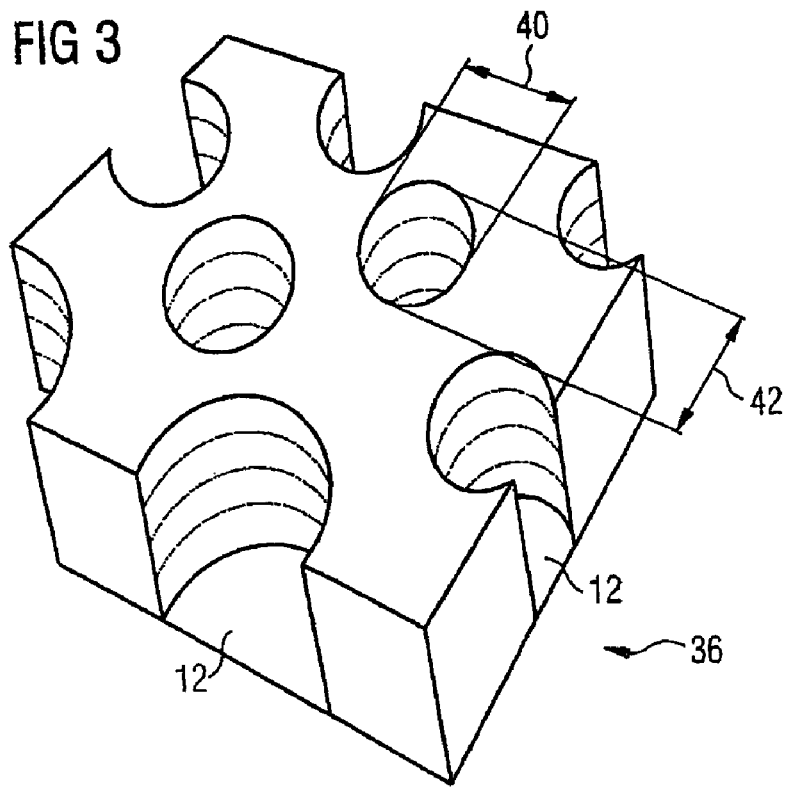
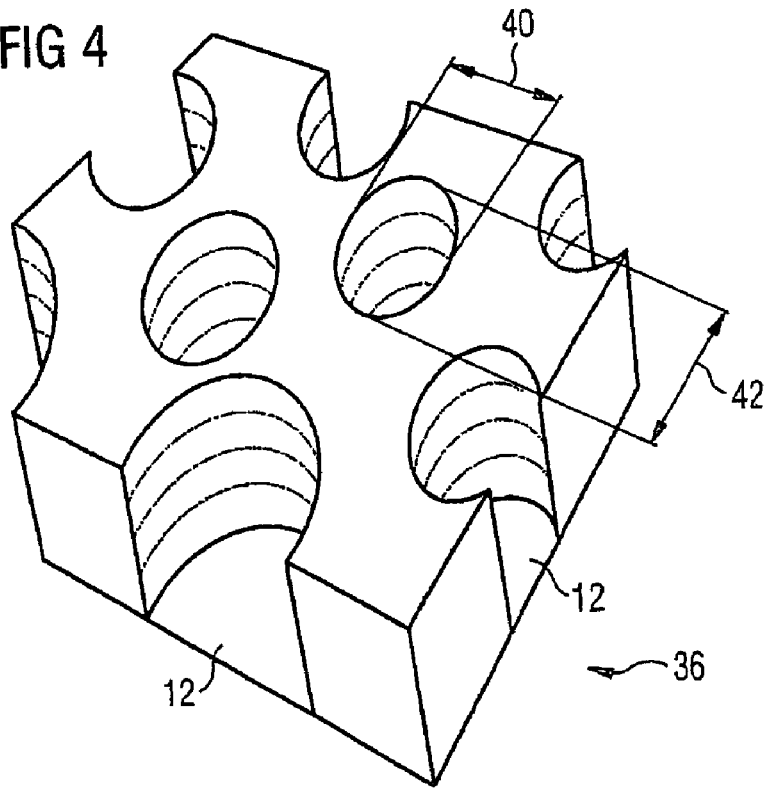

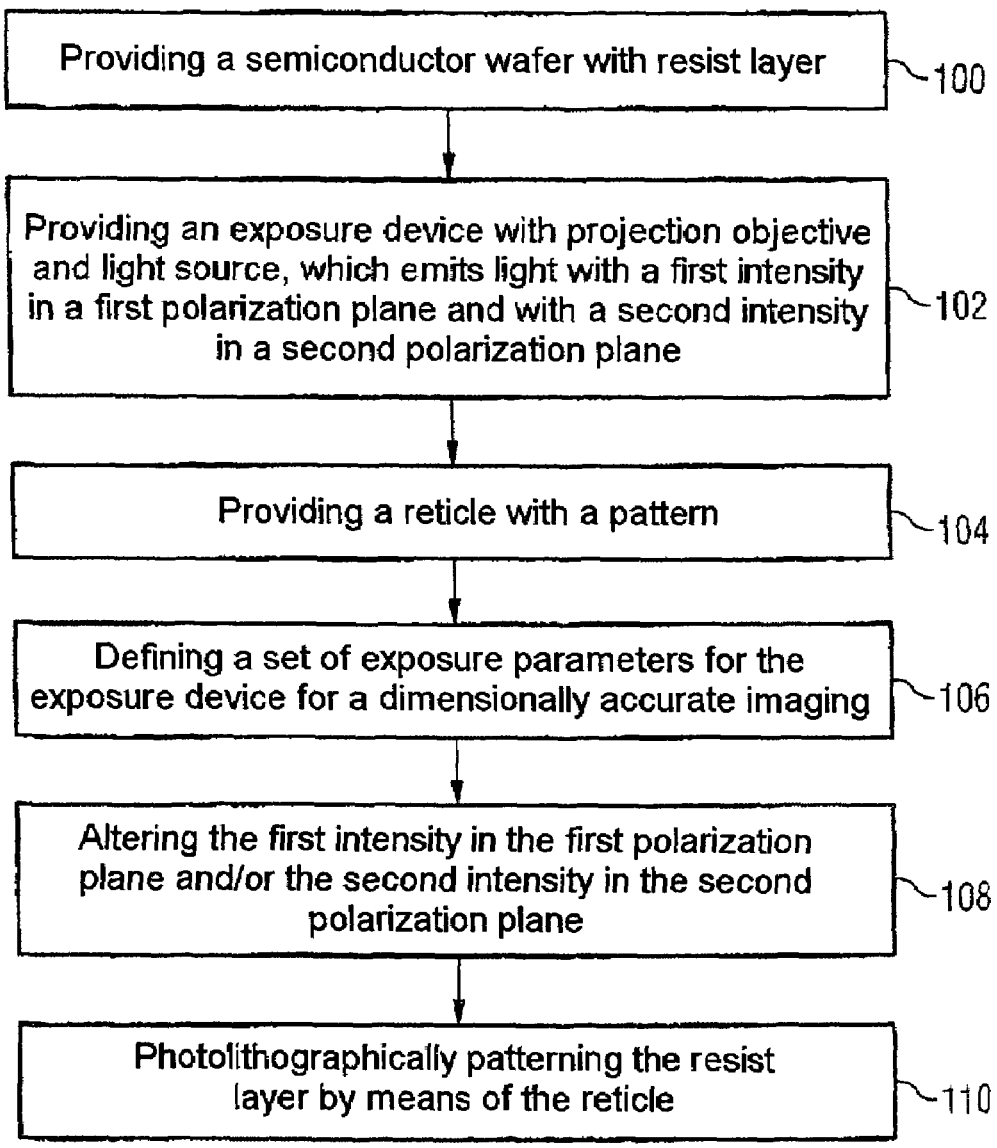

METHOD FOR ADAPTING STRUCTURE DIMENSIONS DURING THE PHOTOLITHOGRAPHIC PROJECTION OF A PATTERN OF STRUCTURE ELEMENTS ONTO A SEMICONDUCTOR WAFER

This application claims priority to German Patent Application 10 2004 031 688.0, which was filed Jun. 30, 2004, and is incorporated herein by reference.

TECHNICAL FIELD

The invention relates to a method for adapting structure dimensions during the photolithographic projection of a pattern of structure elements onto a semiconductor wafer.

BACKGROUND

In order to fabricate integrated circuits, layers provided with different electrical properties are usually applied on a semiconductor substrate, e.g., a semiconductor wafer, and in each case patterned lithographically. A lithographic patterning step may include applying a photosensitive resist, exposing the latter with a desired structure for the relevant plane and developing it, and subsequently transferring the resist mask thus produced into the underlying layer in an etching step or using it for masking during an implantation.

In the field of semiconductor fabrication, use is made of photomasks or reticles on which the pattern is formed in order to form a pattern of structure elements on the semiconductor wafer by means of lithographic projection. During the lithographic projection, however, the lateral extent of the structure elements to be formed on the semiconductor wafer is restricted on account of a lower resolution limit predetermined by the projection system. The resolution limit is usually defined by the smallest distance that can still be separated between two structures formed in adjacent fashion on the surface of the semiconductor wafer. The resolution limit, also called structure resolution, depends on a number of factors. The resolution limit is proportional to the wavelength used during the exposure and inversely proportional to the aperture size of the lens system. However, it also depends for example on the type of illumination source of the projection system and other factors, the influence of which is usually described by means of a so-called k factor.

Large scale integrated circuits such as, by way of example, dynamic or non-volatile memories and also logic components are currently fabricated with circuit elements whose lateral extent reaches down to 70 nm. In the case of memory components, this applies, for example, to the very densely and periodically arranged pattern of narrow word or bit lines and, if appropriate, the corresponding contact connections or memory trenches.

The resolution limit of an optical projection system can be improved in a number of ways. Firstly, it is possible to reduce the exposure wavelength, but this leads to some problems particularly in the deep or extreme UV range. Secondly, it is also possible to use a projection system having a very high numerical aperture, as known, e.g., from immersion lithography. The resolution limit can likewise be reduced by using modern lithographic techniques in the case of the masks used for the exposure. This relates, e.g., to the field of phase masks that are used together with improved lithography techniques (litho-enhancement techniques). Phase masks of different types are used in this case, such as, e.g., alternating phase masks, halftone phase masks, tritone phase masks or chromeless phase masks. However, the techniques mentioned may also involve improvements in the imaging properties during the projection of the pattern on the mask, for example by the use of OPC structures (optical proximity correction) or other sublithographic elements.

All three contributions to improving the resolution are usually optimized in present-day process technology. Projection systems with light having the shortest possible wavelength with the highest possible numerical aperture are used for this purpose. In high-volume production technology it is often desirable to use already existing exposure devices for the next generation of semiconductor products as well, so that reducing the k factor and enlarging the numerical aperture play a critical part.

What is common to both procedures is that the masks used are in this case adapted to conditions prevailing in the exposure device, such as, e.g., type of exposure, but also to the required size of the process window. For this purpose, the pattern of the mask is usually optimized carefully in order to obtain a highest possible product yield. The masks used have to be free of defects, of course, these being monitored precisely prior to use in projection devices and possible defects, if possible, being repaired.

With the continuously increasing integration densities of integrated circuits, the requirement made of the positional accuracy of different layers with respect to one another also increases. The positional accuracy is influenced for example by the lithographic projection step, ever stricter tolerance limits with regard to the mutual orientation of the structure that is currently to be projected onto the substrate relative to the structures of preliminary planes having to be taken into account in order to ensure the functionality of the circuit.

In the high-volume fabrication of integrated circuits, the lateral extents of the individual structure elements of the patterns on each layer contribute to the product yield and are, therefore, subjected to a careful optimization process. In this case, it can happen, in particular, that it is found subsequently that a slight deviation from the previous dimension would result in an increased product yield. This is normally associated with the fact that the mask of the corresponding layer, which mask is carefully optimized and monitored as described above, can possibly no longer be used and has to be renewed. The above-described optimization method for the production of the mask and also the monitoring of the mask for freedom from defects in the latter thus likewise have to be carried out anew. This is associated with high costs and represents a known problem in industrial practice.

SUMMARY OF THE INVENTION

In one aspect, the present invention provides a method that overcomes the above-mentioned problems.

In a first embodiment, a method is used to adapt structure dimensions during the photolithographic projection of a pattern of structure elements onto a semiconductor wafer. The semiconductor wafer is provided with a resist layer applied on the front side. An exposure device with a projection objective and a light source is also provided. This device is suitable for emitting light having a first intensity in a first polarization plane and with a second intensity in a second polarization plane. A reticle with a pattern of structure elements is also provided. The pattern includes at least one first structure element having a first width and a first length. A set of exposure parameters is defined for the exposure device. The exposure parameters are chosen such that a dimensionally accurate imaging results in the case of a projection of the reticle with the pattern. The imaging is achieved by virtue of the fact that the ratio of the first intensity to the second intensity has a first value such that an element corresponding to the first structure element on the resist layer has a second width and a second length. The first intensity is altered in the first polarization plane and/or the second intensity is altered in the second polarization plane. The resist layer is photolithographically patterned by means of the reticle in order to form a resist structure. The first intensity and the second intensity are chosen such that the second length, in a manner dependent on the first intensity and the second intensity, deviates by up to 30% from the length obtained in the case of dimensionally accurate imaging.

According to embodiments of the invention, an exposure device is provided that can emit light in two polarization planes. Through the choice of the degree of polarization, i.e., the ratio of the intensity in the first polarization plane to the intensity in the second polarization plane, it is possible to alter the ratio of width to length of the structure formed on the resist layer. A variation of approximately 30% with respect to dimensionally accurate imaging can thus be achieved in a simple manner. This suffices to bring about adaptations of the structure dimensions during the improvement of the product yield. It is not necessary to produce a new mask.

In one preferred embodiment, the step of providing the exposure device comprises the fact that the first polarization plane is oriented essentially perpendicular to the top side of the resist layer.

What can be achieved in accordance with this procedure is that the light that usually impinges on the top side of the resist layer within a certain aperture angle impinges in a fixed dependence with respect to the position of the resist layer or the patterns of the structure elements.

In a further embodiment, the step of providing the exposure device comprises the fact that the first polarization plane corresponds to a transversely polarized electromagnetic wave with a TE polarization.

Modern lithography devices often have light sources that emit transversely polarized TE waves. In accordance with this procedure, it is possible to use a commercially available exposure device so that no additional costs arise.

In a further preferred embodiment, the step of providing the exposure device comprises the fact that the second polarization plane is oriented essentially perpendicular to the first polarization plane.

What can be achieved in accordance with this procedure is that the first and second polarization planes have a predetermined position with respect to the structure elements of the pattern.

In a further preferred embodiment, the step of providing the exposure device comprises the fact that the second polarization plane corresponds to a transversely polarized electromagnetic wave with a TM polarization.

Modern exposure devices often have the possibility of emitting TM-polarized light. Consequently, the invention can be embodied in a simple manner.

In a further preferred embodiment, the step of providing the exposure device comprises the fact that the numerical aperture of the exposure device is chosen with a magnitude such that light of the first polarization plane effects a chemical alteration of the resist layer, which is greater than in the case of irradiation with light of the second polarization plane given identical intensity.

The numerical aperture of the exposure device specifies the aperture angle of the incident light on the top side of the resist layer. During the lithographic projection, light brings about a chemical alteration of the resist layer, light-sensitive molecules being altered by the light preferably arriving in the UV range. This is also referred to as blackening by analogy with photographic technology. Given identical intensities, the degree of blackening is dependent on the polarization of the incident light. By virtue of the fact that the first polarization plane is perpendicular to the resist layer and the second plane is parallel thereto, a large difference between the polarization planes is brought about, which difference depends, however, on the aperture angle of the incident light. The larger the numerical aperture, the greater the difference between light of the first polarization plane and light of the second polarization plane.

In a further preferred embodiment, the step of providing the exposure device comprises the fact that the numerical aperture of the exposure device is at least 0.6.

A numerical aperture of approximately 0.6 can be obtained relatively simply with commercial exposure devices which, by way of example, implement an exposure in which the volume between the reticle is filled with a gas or a liquid, so that commercial exposure devices can be used. Consequently, the invention can be used both for conventional lithography devices and in immersion lithography.

In a further preferred embodiment, the step of providing the reticle with the pattern comprises the fact that a multiple arrangement of the first structure element of the pattern is provided, the multiple arrangement of the first structure element being suitable for forming the pattern of trenches for trench capacitors and/or contact holes of a memory cell array.

In accordance with this procedure, the pattern to be used in one of the first layers of a memory component is provided for the pattern of structure elements. The pattern usually has the highest requirements with regard to the resolution capability of the projection device, so that the associated mask usually employs one or more available improvement options appertaining to lithography technology. Embodiments of the invention prove to be particularly advantageous since it is possible to carry out an adaptation in the structure dimensions through the choice of intensity of the first and second polarization planes in a simple manner.

Advantageous developments of the invention are specified in the descriptions herein.

BRIEF DESCRIPTION OF THE DRAWINGS

The present invention will now be explained in more detail on the basis of a plurality of exemplary embodiments with the aid of a drawing, in which:

FIG. 3 schematically shows, in a plan view, a partial view of a pattern of structure elements obtained by means of a simulation calculation;

FIG. 4 shows, in a further plan view, a simulated resist structure after the exposure; and FIG. 5 shows, in a flow diagram, the steps of the method according to the invention in one embodiment.

Figure 1:
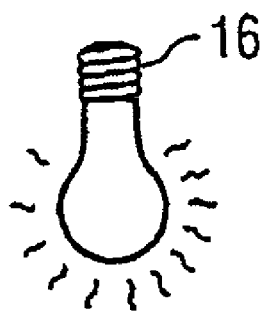
FIG. 1 shows, in a schematic cross-sectional view, an exposure apparatus for application of the method according to the invention.
Figure 1:
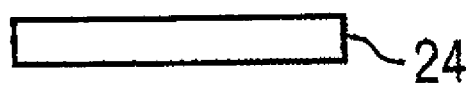
Figure 1:
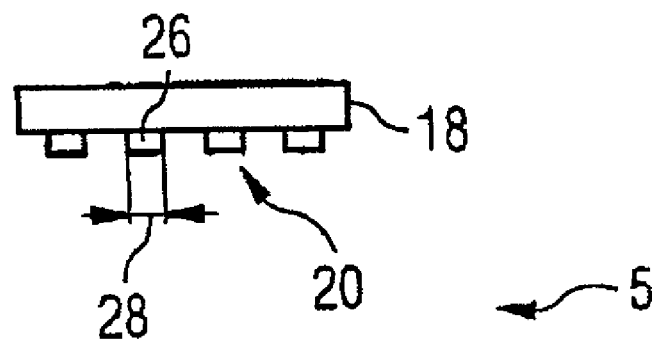
Figure 1:
Figure 1:
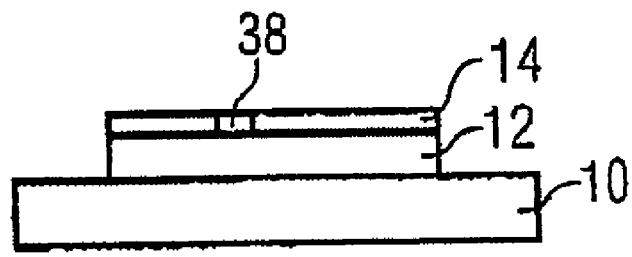

The following list of reference symbols can be used in conjunction with the figures:

5 Exposure device
10 Substrate holder
12 Semiconductor wafer
14 Resist layer

16 Light source
18 Reticle
20 Pattern
22 Projection objective
24 Polarization filter
26 Structure element of the pattern
28 First width
30 First length
32 First polarization plane
34 Second polarization plane
36 Resist structure
38 Element of the resist structure
40 Second width
42 Second length
50 First direction of incidence
51 Second direction of incidence
52 System of coordinates
54 Aperture angle
100-110 Method steps

DETAILED DESCRIPTION OF ILLUSTRATIVE EMBODIMENTS

The invention is explained below by way of example on the basis of an embodiment for projecting a pattern of structure elements onto a semiconductor wafer during the production of an integrated circuit. However, the method according to embodiments of the invention can also be used advantageously in the production of other products in which an adaptation of the dimensions of the structure elements has to be carried out during production.

FIG. 1 shows, in a schematic cross-sectional view, the construction of a projection apparatus 5, which is the starting point of the method according to embodiments of the invention. The projection apparatus 5 comprises a moveable substrate holder 10. A semiconductor wafer 12 is placed on the substrate holder 10, a resist layer 14 being applied to the wafer on a front side, for example by spinning-on.

The projection apparatus 5 furthermore comprises a light source 16, which is arranged above the substrate holder 10 and is suitable for emitting light having, for example, a wavelength of 248 nm, 193 nm or 157 nm. The light emitted by the light source 16 is projected through a projection objective 22 onto the surface of the semiconductor wafer 12 with the resist layer 14.

A reticle 18 provided with a pattern 20 of absorbent structure elements is fitted between the light source 16 and the projection objective 22. An example of a projection apparatus 5 that may be used is a wafer scanner in which an exposure slot is fitted between the reticle 18 and the projection objective 22 (not shown in FIG. 1). Through the control of the substrate holder 10, the resist layer on the front side of the semiconductor wafer 12 is progressively patterned in individual exposure fields with the pattern 20 of the reticle 18.

The pattern 20 of the structure elements 26 is determined for example from a circuit design of a semiconductor memory having dynamic memory cells (DRAM) comprising trench capacitors, which has linear structure elements with extremely small dimensions of 100 nm or less that are densely packed and arranged regularly in the region of the trench capacitors.

A multiplicity of different mask types can be used for the reticle 18. The example presented in connection with FIG. 1 with absorbent structure elements 26, comprising chromium for example, represents only one example and is not to be understood as restrictive. In particular, nowadays mask types are used that utilize the phase-shifting behavior of the mask substrate and manage without a chromium layer as absorbent element. A CPL mask shall be mentioned as an example here. Further mask types, such as, e.g., an alternating phase mask, are likewise possible. In order to improve the dimensional accuracy during the photolithographic imaging, provision is made for using OPC structures (OPC=optical proximity correction) or other suitable additional structures, which are chosen to be large enough that they are not imaged in the case of an exposure.

In FIG. 1, a polarization filter 24 is depicted schematically between the reticle 18 and the light source 16. The polarization filter 24 attenuates light with different polarization planes, for example, to different extents. Instead of a polarization filter 24, a grating structure is also conceivable in which light with different polarization planes is refracted to different extents. The use of a prism is also possible. Other methods known to a person skilled in the art for the selection of different polarization planes are not ruled out. It is also conceivable, moreover, that the light source 16 can be influenced directly in order to emit light in different polarization planes.

Light of the exposure device 5 is usually emitted in two different polarization planes. This is illustrated in FIG. 2a and FIG. 2b.

Figure 2A:
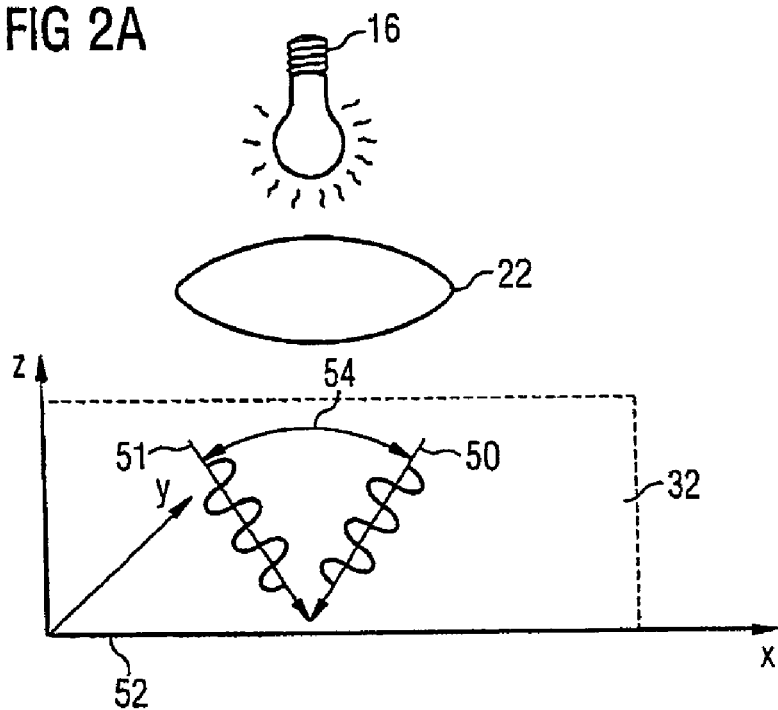
FIG. 2a shows, in a schematic cross-sectional view, the exposure apparatus in accordance with FIG. 1, a first polarization plane being depicted for illustration purposes.

FIG. 2a depicts a system 52 of Cartesian coordinates, the front side of the semiconductor wafer 10 (not shown) lying in the xy plane. The light source 16, which has a certain aperture angle 54 on account of the numerical aperture of the projection apparatus 5 on the top side of the semiconductor wafer, emits light in a first polarization plane 32 such that the light from the first direction 50 of incidence and second direction 51 of incidence, which delimit the aperture angle 54, has a polarization lying in the xz plane of the system 52 of Cartesian coordinates.

Figure 2B:
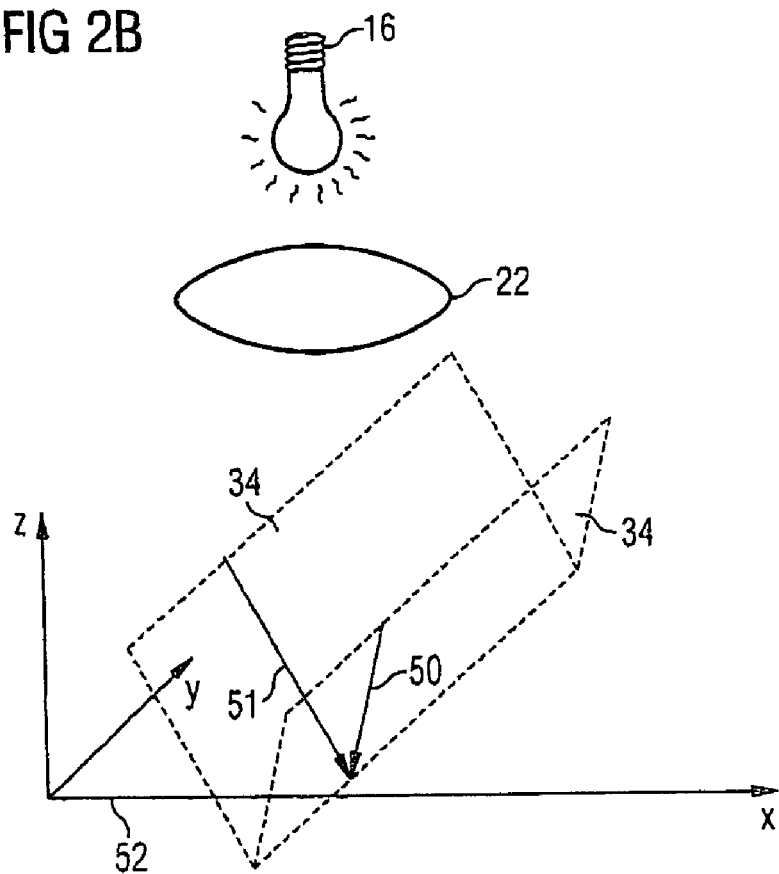
FIG. 2b shows, in a further schematic cross-sectional view, the exposure apparatus in accordance with FIG. 1, a second polarization plane being depicted for illustration purposes.

FIG. 2b shows a second polarization plane 34, which is perpendicular to the first polarization plane 32. The second polarization plane 34 points in the direction of the y axis of the system 52 of Cartesian coordinates and contains the first direction 50 of incidence and the second direction 51 of incidence.

The first polarization plane 32 and the second polarization plane 34 defined in FIG. 2a and FIG. 2b represent two transversely polarized electromagnetic waves, the first polarization, corresponding to the polarization plane 32, usually being called TE polarization. Light of the second polarization, corresponding to the second polarization plane 34, is usually called TM polarization.

As can be seen in FIG. 2a and FIG. 2b, the difference between the two polarization directions is all the greater, the larger the aperture angle 54. In order, then, to bring about a chemical alteration of the resist layer 14 that differs in a manner dependent on the exposure, the exposure device 5 must have a certain minimum numerical aperture in order to achieve an appreciable effect. For this purpose, it is necessary, for example, to provide a minimum numerical aperture of approximately 0.6 in the case of an optical projection in a gas volume. However, this is readily possible with conventional exposure devices. In the case of a gas-filled volume, for example air or nitrogen with a refractive index of 0.95 to 1.05, between the top side of the semiconductor wafer 12 and the projection objective 22, a numerical aperture of approximately 0.85 is achieved nowadays.

A further improvement in the numerical aperture may be achieved for example by filling the volume between the projection objective 22 and the front side of the semiconductor wafer 12 with a liquid. Liquids usually have a refractive index that is greater than the refractive index of gases, so that the numerical aperture becomes correspondingly larger. This is utilized in so-called immersion lithography, numerical apertures of between 1.1 and 1.6 currently being achieved.

As shown in FIG. 1, the structure element 26 of the pattern 20 is oriented such that the first width 28 lies in the x direction of the system 52 of coordinates, its first length 30 being arranged in the direction of the y axis. Through the choice of the intensities of the light in the first polarization plane 32 and the second polarization plane 34, it is thus possible to influence the length-to-width ratio on the element 38 of the resist structure that corresponds to the structure element 26. In this case, the resist structure is produced by etching the resist layer 14 after the exposure.

FIG. 3 schematically shows a resist structure 36 produced by etching, a dark field imaging of a pattern of contact holes having been transferred in this case. The second width 40 corresponding to the first width and the second length 42 are chosen in the case of dimensionally accurate imaging such that the second width 40 is approximately 80 nm and the second length 42 is approximately 100 nm.

By altering the intensities of the light of the first polarization plane and the second polarization plane, it is possible to vary the second length 42, in terms of magnitude approximately a relative change in the second length 42 by up to 30% being achieved. In order to achieve an enlargement of the structure dimension by 30%, fully TM-polarized light is used. Fully TE-polarized light is correspondingly used in order to reduce the size of the resist structure 36 by up to 23% in the y direction. In this case, the total exposure dose resulting from the sum of the intensity of the light of the first polarization plane 32 and the intensity of the light of the second polarization plane 34 must, of course, be chosen to be large enough that the resist layer 14 is exposed through completely down to the top side of the semiconductor wafer 12. This is necessary in order to be able to form the resist structure 36 such that its structure elements can be uncovered down to the top side of the semiconductor wafer 12 during development.

In FIG. 5, an embodiment of the method according to embodiments of the invention, is shown in summary in a flow diagram.

A first step 100 involves providing the semiconductor wafer 12 with a resist layer 14 applied on the front side.

Afterward, step 102 involves providing an exposure device 5 with a projection objective 22 and a light source 16, which is suitable for emitting light with a first intensity in a first polarization plane 32 and with a second intensity in a second polarization plane 34.

Step 104 involves providing a reticle 18 with a pattern 20 of structure elements, the pattern 20 comprising at least one first structure element 26 having a first width 28 and a first length 30.

Step 106 involves defining a set of exposure parameters for the exposure device 5, the exposure parameters being chosen such that a dimensionally accurate imaging results in the case of a projection of the reticle 18 with the pattern 20, the imaging being achieved by virtue of the fact that the ratio of the first intensity to the second intensity has a first value such that an element 38 corresponding to the first structure element 26 on the resist layer has a second width 40 and a second length 42.

Afterward, step 108 involves altering the first intensity in the first polarization plane 32 and/or the second intensity in the second polarization plane 34.

Afterward, step 110 involves carrying out a photolithographic patterning of the resist layer 14 by means of the reticle 18 in order to form a resist structure 36, the first intensity and the second intensity being chosen such that the second length 42, in a manner dependent on the first intensity and the second intensity deviates by up to 30% from the length obtained in the case of the dimensionally accurate imaging.

What is claimed is:

1. A method for adapting structure dimensions during a photolithographic projection of a pattern of structure elements onto a semiconductor wafer, the method comprising:
   providing a semiconductor wafer with a resist layer applied on a front side;
   providing an exposure device with a projection objective and a light source, the exposure device suitable for emitting light having a first intensity in a first polarization plane and with a second intensity in a second polarization plane;
   providing a reticle with a pattern of structure elements, the pattern comprising at least one first structure element having a first width and a first length;
   defining a set of exposure parameters for the exposure device, the exposure parameters being chosen such that a dimensionally accurate imaging results from a projection of the reticle with the pattern, said imaging being achieved using a ratio of the first intensity to the second intensity that has a first value such that an element corresponding to the first structure element on the resist layer has a second width and a second length;
   altering the first intensity in the first polarization plane and/or the second intensity in the second polarization plane; and
   photolithographically patterning the resist layer by means of the reticle in order to form a resist structure, the first intensity and the second intensity being chosen such that the second length, in a manner dependent on the first intensity and the second intensity, deviates by up to 30% from the length obtained from the dimensionally accurate imaging, wherein the second width is about as dimensionally accurate imaging width obtained with the first value.

2. The method as claimed in claim 1, wherein the first polarization plane is oriented essentially perpendicular to a top side of the resist layer.

3. The method as claimed in claim 1, wherein the first polarization plane corresponds to a transversely polarized electromagnetic wave with a TE polarization.

4. The method as claimed in claim 1, wherein the second polarization plane is oriented essentially perpendicular to the first polarization plane.

5. The method as claimed in claim 1, wherein the second polarization plane corresponds to a transversely polarized electromagnetic wave with a TM polarization.

6. The method as claimed in claim 1, wherein providing the exposure device comprises providing an exposure device with a numerical aperture that is chosen with a magnitude such that light of the first polarization plane effects a chemical alteration of the resist layer which is greater than in the case of irradiation with light of the second polarization plane given identical intensities.

7. The method as claimed in claim 1, wherein while photolithographically patterning the resist layer, a volume between the projection objective and the resist layer is filled with a gas having a refractive index of less than about 1.05.

8. The method as claimed in claim 7, wherein the volume between the projection Objective and the resist layer is filled with nitrogen or air.

9. The method as claimed in claim 7, wherein providing the exposure device comprises providing an exposure device with a numerical aperture of at least 0.6.

10. The method as claimed in claim 9, wherein the numerical aperture of the exposed device is approximately 0.85.

11. The method as claimed in claim 1, wherein at least while photolithographically patterning the resist layer, a volume between the projection objective and the resist layer is filled with a liquid having a refractive index of between about 1.2 and about 1.8.

12. The method as claimed in claim 11, wherein providing the exposure device comprises providing an exposure device with a numerical aperture of at least 1.0.

13. The method as claimed in claim 12, wherein the numerical aperture of the exposure device is approximately 1.2.

14. The method as claimed in claim 1, wherein the first intensity in the first polarization plane and the second intensity in the second polarization plane are chosen such that the second length is 30% less than the length obtained from the dimensionally accurate imaging.

15. The method as claimed in claim 14, wherein a ratio of the second intensity to the first intensity is less than 5%.

16. The method as claimed in claim 1, wherein the first intensity in the first polarization plane and the second intensity in the second polarization plane are chosen such that the second length is 30% greater than the length obtained from the dimensionally accurate imaging.

17. The method as claimed in claim 16, wherein the ratio of the first intensity to the second intensity is less than 5%.

18. The method as claimed in claim 1, wherein providing the reticle with the pattern comprises providing a multiple arrangement of the first structure element of the pattern, the multiple arrangement of the first structure element suitable for forming a pattern of trenches for trench capacitors of a memory cell array.

19. The method as claimed in claim 1, wherein providing the reticle with the pattern comprises providing a multiple arrangement of the first structure element of the pattern, the multiple arrangement of the first structure element suitable for forming contact holes of a semiconductor device.

20. The method of claim 19, wherein the semiconductor device comprises a memory cell array.

21. A method for forming contact holes, the method comprising:

forming a photo resist layer over a substrate;
providing an exposure device with a means to modulate light impinging on a reticle, the light comprising a first intensity in a first polarization plane and a second intensity in a second polarization plane, wherein a first lightbeam projected through a structural element on the reticle using a first ratio of the first intensity to the second intensity forms a dimensionally accurate structure comprising a first length and a first width on the photo resist layer; and forming a structural element on the photo resist layer by exposing the photo resist layer using a second lightbeam projected through the structural element on the reticle, the second lightbeam comprising a second ratio of the first intensity to the second intensity, the structural element on the photo resist layer comprising a second length and a second width, wherein the second length is about 30% larger or smaller than the first length, and wherein the second width is about the same as the first width obtained with the first ratio.

22. The method as claimed in claim 21, wherein the first polarization plane corresponds to a transversely polarized electromagnetic wave with a TE polarization.

23. The method as claimed in claim 22, wherein the second polarization plane corresponds to a transversely polarized electromagnetic wave with a TM polarization.

24. A method for forming contact holes, the method comprising:

forming a photo resist layer over a substrate;
defining an ideal exposure for forming an ideal pattern for a contact hole on the photo resist layer by exposing the photo resist layer through a structural element on a reticle, a lightbeam of the ideal exposure comprising a first ratio of a first intensity in a first polarization plane and a second intensity in a second polarization plane, the ideal pattern comprising a second ratio of length to width, wherein the second polarization plane is oriented about perpendicular to the first polarization plane; and
forming a pattern using a modified exposure, the modified exposure being different from the ideal exposure and using a lightbeam comprising a third ratio of the first intensity and the second intensity, the pattern comprising a fourth ratio of length to width, wherein the fourth ratio differs from the second ratio by about 30%.

25. The method of claim 24, wherein the length of the pattern varies about 30% from the length of the ideal pattern.

26. The method of claim 25, wherein the first intensity of the modified exposure is greater than the first intensity of the ideal exposure.

27. The method of claim 26, wherein the first polarization plane corresponds to a transversely polarized electromagnetic wave with a TE polarization.

28. The method of claim 24, wherein the width of the pattern varies about 30% from the width of the ideal pattern, and wherein the length of the pattern is about the same as the length of the ideal pattern.

29. The method of claim 28, wherein the second intensity of the modified exposure is greater than the second intensity of the ideal exposure.

30. The method of claim 29, wherein the second polarization plane corresponds to a transversely polarized electromagnetic wave with a TM polarization.

* * * * *